(12) United States Patent
Yamada et al.

(10) Patent No.: US 6,233,944 B1
(45) Date of Patent: May 22, 2001

(54) THERMOELECTRIC MODULE UNIT

(75) Inventors: Kazukiyo Yamada, Chiba; Syohei Ito, Tokyo, both of (JP)

(73) Assignees: Morix Co., Ltd., Aichi; Seiko Seiki Co., Ltd., Chiba, both of (JP)

( * ) Notice: Subject to any disclaimer, the term of this patent is extended or adjusted under 35 U.S.C. 154(b) by 0 days.

(21) Appl. No.: 09/331,276

(22) PCT Filed: Oct. 21, 1998

(86) PCT No.: PCT/JP98/04756

§ 371 Date: Sep. 23, 1999

§ 102(e) Date: Sep. 23, 1999

(87) PCT Pub. No.: WO99/21234

PCT Pub. Date: Apr. 29, 1999

(30) Foreign Application Priority Data

Oct. 21, 1997 (JP) .................................................. 9-288250

(51) Int. Cl.$^7$ ...................................................... F25B 21/02
(52) U.S. Cl. ...................................................................... 62/3.7
(58) Field of Search ........................... 62/3.7; 165/104.21

(56) References Cited

U.S. PATENT DOCUMENTS

| | | |
|---|---|---|
| 2,844,638 | 7/1958 | Lindenblad . |
| 3,212,274 * | 10/1965 | Eidus ............................................. 62/3 |
| 3,834,171 | 9/1974 | Johansson . |
| 4,253,515 * | 3/1981 | Swiatosz ................................ 165/61 |
| 5,713,208 * | 2/1998 | Chen et al. ............................. 62/3.7 |

FOREIGN PATENT DOCUMENTS

| | | |
|---|---|---|
| 11 74 810 | 7/1964 | (DE) . |
| 2 119 169 | 11/1983 | (GB) . |

* cited by examiner

Primary Examiner—Michael Buiz
Assistant Examiner—Melvin Jones
(74) Attorney, Agent, or Firm—Dellett and Walters

(57) ABSTRACT

A thermoelectric module unit is provided with a thermoelectric module that comprises a partitioning plate, a thermoelectric semiconductor element fixed to the partitioning plate in a state passing through the partitioning plate but also in a state that is electrically insulated from the partitioning plate. A first metal electrode is connected to a first surface of the thermoelectric semiconductor element, and a second metal electrode is connected to a second surface of the thermoelectric semiconductor element. A first confined portion encloses a region from the partitioning plate towards the first surface and is also connected to a first heat pipe. An operating fluid is vacuum-sealed within the first confined portion and the first heat pipe.

12 Claims, 11 Drawing Sheets

THERMOELECTRIC MODULE UNIT

FIELD OF THE INVENTION

This invention relates to a thermoelectric module unit provided with a thermoelectric semiconductor element, such as a Peltier element, and a heat pipe.

BACKGROUND OF THE INVENTION

Thermoelectric elements that use thermoelectric semiconductor elements made of compounds such as bismuth/tellurium compounds, iron/silicon compounds, or cobalt/antimony compounds are used in applications such as cooling/heating devices. Such a thermoelectric element is convenient as a cooling/heating source that does not use liquids or gases, takes up little space, is not subject to rotational friction, and does not require maintenance.

The structure of a thermoelectric module that is known in the prior art is shown in FIGS. 11A and 11B. In this case, FIG. 11A is a front view and FIG. 11B is a perspective view. As shown in these figures, thermoelectric semiconductor elements 33 consisting of n-type thermoelectric semiconductor elements and p-type thermoelectric semiconductor elements are arrayed alternately, and upper and lower surfaces of the thermoelectric semiconductor elements 33 are connected to metal electrodes 32 and metal electrodes 34, respectively. The thermoelectric semiconductor elements 33 are connected alternately by the upper and lower surfaces thereof to the metal electrodes 32 and the metal electrodes 34, so that all of the thermoelectric semiconductor elements 33 are eventually connected electrically in series. The connections between the upper and lower metal electrodes 32 and 34 and the thermoelectric semiconductor elements 33 are performed by soldering. The metal electrodes 32 and 34 at these upper and lower surfaces are connected onto metallized ceramic substrates 31 and 33, respectively, to fix the entire assembly together.

A DC power source is connected to the electrodes of this thermoelectric module. When a current flows in the direction from each n-type thermoelectric semiconductor element to a p-type thermoelectric semiconductor element, the Peltier effect ensures that heat is absorbed by the upper portion of each $\pi$ shape and heat is emitted from the lower portion thereof. In other words, each $\pi$-shaped upper portion acts as an absorbing-side cold junction (CJ) and each lower portion thereof acts as a radiating-side hot junction (HJ) as shown in FIG. 11A. Reversing the connection direction of the power source changes the directions in which heat is absorbed and emitted. This phenomenon is utilized so that the thermoelectric element can be used in a cooling/heating device. Such a thermoelectric module is useful in a wide range of applications, from the cooling of devices such as large-scale integrated circuits (LSIs), computer central processing units (CPUs), and lasers, to use in insulated refrigerators.

If such a thermoelectric module is used as a cooling device, it is necessary to disperse heat efficiently from the heat-radiating side. Methods that are used in the art for dispersing heat from the heat-radiating side of a thermoelectric module include an air-cooling method wherein radiator fins 41 are attached to the heat-radiating side of the thermoelectric module and wind from a fan 42 is directed towards these radiator fins 41, as shown in FIG. 12A, and a liquid-cooling method wherein a liquid-cooling jacket 51 is attached to the heat-radiating side of the thermoelectric module and a coolant passes from a liquid inlet 52 of this liquid-cooling jacket 51 to a liquid outlet 53 thereof, as shown in FIG. 12B. Note that the hollow arrows in FIG. 12A indicate the flow of air and the solid arrows in FIG. 12B indicate the flow of coolant. In both FIGS. 12A and 12B, CL denotes a cooling load.

However, since the thermoelectric semiconductor elements in each of these cooling devices are cooled indirectly through a ceramic substrate on the lower sides thereof, the heat cannot be dispersed efficiently from the heat-radiating side of the thermoelectric module. In addition, the ceramic substrates that are fixed above and below the thermoelectric module of FIG. 11 form a rigid structure, so that large thermal stresses are inevitably applied to the thermoelectric semiconductor elements during operation, and thus the lifetime of these thermoelectric semiconductor elements is short.

The present inventors have already proposed a thermoelectric module, together with a thermoelectric cooling unit that uses this thermoelectric module, in which thermal stresses on the thermoelectric semiconductor element are alleviated by directly cooling the heat-radiating side of the thermoelectric semiconductor elements and the metal electrodes that are connected thereto, to disperse heat efficiently from the heat-radiating side, and also by making the structure a double-sided skeleton structure (Japanese Patent Application No. 8-354136).

In the previously proposed thermoelectric cooling unit, the heat-radiating side of the thermoelectric semiconductor elements and the metal electrodes connected thereto are cooled directly, so that heat can be efficiently dispersed from the heat-radiating side and thus the capabilities of the thermoelectric semiconductor element can be fully utilized. Since the thermal stresses applied to the thermoelectric semiconductor elements are alleviated, a longer lifetime is achieved for the thermoelectric semiconductor elements.

An objective of this invention is to provide a thermoelectric module unit using a thermoelectric module of a double-sided skeleton structure, which enables an improvement in the heat-dispersion efficiency.

SUMMARY OF THE INVENTION

A thermoelectric module unit in accordance with this invention is provided with a thermoelectric module that comprises a partitioning plate, a thermoelectric semiconductor element fixed to the partitioning plate in a state passing through the partitioning plate but also in a state that is electrically insulated from the partitioning plate, a first metal electrode connected to a first surface of the thermoelectric semiconductor element, and a second metal electrode connected to a second surface of the thermoelectric semiconductor element; and a first confined portion which encloses a region from the partitioning plate towards the first surface and which is also connected to a first heat pipe; wherein an operating fluid is vacuum-sealed within the first confined portion and the first heat pipe.

In this thermoelectric module unit, a space of a sealed configuration is formed by the partitioning plate, the first heat pipe, and the first confined portion, and an operating fluid is vacuum-sealed therein. This operating fluid turns into steam when heated and thus absorbs heat by the latent heat of evaporation thereof. This steam moves at high speed towards a low-temperature portion. It is condensed by this low-temperature portion to become a liquid. During this process, heat is dispersed by the latent heat of condensation thereof. The operating fluid is returned to the heated portion by capillary action, and the cycle of steam generation/movement/condensation is repeated to transfer heat continuously.

The configuration could also be further provided with a second confined portion which encloses a region from the partitioning plate towards the second surface and which is also connected to a second heat pipe, wherein an operating fluid is vacuum-sealed into the second heat pipe. In such a case, if the first heat pipe is on a heat-radiating side, the second heat pipe is on a heat-absorbing side.

This thermoelectric module could be configured in such a manner that identical numbers of p-type thermoelectric semiconductor elements and n-type thermoelectric semiconductor elements are fixed to the partitioning plate, and also all of the thermoelectric semiconductor elements are connected electrically in series by the first metal electrode and the second metal electrode. The configuration could also be such that only one of a group of p-type thermoelectric semiconductor elements or a group of n-type thermoelectric semiconductor element is fixed to the partitioning plate, and also first surfaces of all of the p-type thermoelectric semiconductor elements or the n-type thermoelectric semiconductor elements are connected in common by the first metal electrode, and second surfaces of all of the p-type thermoelectric semiconductor elements or the n-type thermoelectric semiconductor elements are connected in common by the second metal electrode. In the latter thermoelectric module, a block could be formed by alternately stacking thermoelectric modules in which only p-type thermoelectric semiconductor elements are fixed to the partitioning plates thereof and thermoelectric modules in which only n-type thermoelectric semiconductor elements are fixed to the partitioning plates thereof, wherein metal electrodes of adjacent portions are used in common. Furthermore, blocks of alternately stacked thermoelectric modules could be disposed in a plurality of groups in the horizontal direction. In such a case, it is preferable that partitioning plates at the same height are formed integrally in the horizontal direction.

To ensure an electrically insulated state between each partitioning plate and the corresponding thermoelectric semiconductor elements, either the partitioning plate is formed of an electrically insulating material or the peripheries of the thermoelectric semiconductor elements are covered with an electrically insulating material.

To improve the strength of the partitioning plates, it is preferable to utilize a structure such that each partitioning plate is formed of a metal, or the thickness of each partitioning plate is increased, or two plates are provided and the space therebetween is filled with a resin to fix them together.

A thermoelectric module unit in accordance with another aspect of this invention is provided with a first thermoelectric module that comprises a first partitioning plate, a p-type thermoelectric semiconductor element fixed to the first partitioning plate in a state passing through the first partitioning plate but also in a state that is electrically insulated from the first partitioning plate, a first metal electrode connected to a first surface of the p-type thermoelectric semiconductor element, and a second metal electrode connected to a second surface of the p-type thermoelectric semiconductor element; alternately stacked with a second thermoelectric module that comprises a second partitioning plate, an n-type thermoelectric semiconductor element fixed to the second partitioning plate in a state passing through the second partitioning plate but also in a state that is electrically insulated from the second partitioning plate, a third metal electrode connected to a first surface of the n-type thermoelectric semiconductor element, and a fourth metal electrode connected to a second surface of the n-type thermoelectric semiconductor element; wherein a heat pipe is sandwiched between adjacent thermoelectric modules. In addition, a heat pipe could be attached to the top of the uppermost thermoelectric module and the bottom of the lowermost thermoelectric module.

BEST MODE FOR CARRYING OUT THE INVENTION

Figure 1A:
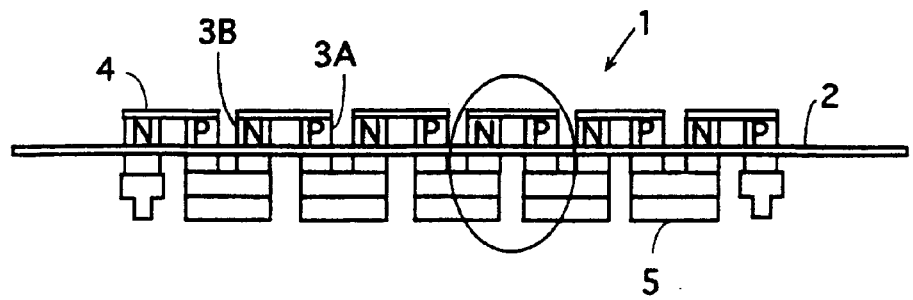
FIG. 1 shows the structure of a thermoelectric module in accordance with an embodiment of this invention, together with a view illustrating the operation thereof.

The structure of a thermoelectric module in accordance with an embodiment of this invention is shown in FIG. 1A. This thermoelectric module is basically the same as the thermoelectric module proposed in the above mentioned Japanese Patent Application No. 8-354136 (Japanese Patent Application Laid-Open No. 10-178216).

This thermoelectric module 1 is configured of p-type thermoelectric semiconductor elements 3A and n-type thermoelectric semiconductor elements 3B fixed to a partitioning plate 2 formed of a resin that is electrically insulating, such as a glass epoxy, in a state such that they pass therethrough. Note that the means of implementing this structure, wherein thermoelectric semiconductor elements are fixed to a single partitioning plate in a state such that they pass therethrough, is described in detail in Japanese Patent Application No. 7-276751 (Japanese Patent Application Laid-Open No. 8-228027) so further description thereof is omitted.

Flat copper electrodes 4 are connected by soldering to upper surfaces of the p-type thermoelectric semiconductor elements 3A and the n-type thermoelectric semiconductor elements 3B, and copper electrodes 5 having side surfaces in the shape of the letter T (hereinafter called "T-shaped copper electrodes") are connected by soldering to lower surfaces thereof. No ceramic substrate is provided on either the upper surfaces of the copper electrodes 4 or the lower surfaces of the T-shaped copper electrodes 5. The resultant structure in which substrates are not fixed to the metal electrodes, leaving them bare, is called a skeleton structure. Since the upper and lower metal electrodes of thermoelectric module shown in this figure are both bare, this is a double-sided skeleton structure.

An enlarged front view of one of the T-shaped copper electrodes 5 of FIG. 1A is shown in FIG. 1B, an enlarged side view thereof is shown in FIG. 1C, and an enlarged base view is shown in FIG. 1D. The seven T-shaped copper electrodes 5 shown in FIG. 1A are all of the same shape and dimensions, but the two outermost ones are orientated and attached in such a manner that the side surfaces thereof are visible, as shown in FIG. 1C, and the other five are orientated and attached in such a manner that the front surfaces thereof are visible, as shown in FIG. 1B.

The operation of the thermoelectric module of FIG. 1A is illustrated in FIG. 1E, which is an enlargement of the pair of thermoelectric semiconductor elements shown encircled in FIG. 1A. When the thermoelectric module of FIG. 1A is in use, the T-shaped copper electrodes 5 and a portion of each of the p-type thermoelectric semiconductor elements 3A and the n-type thermoelectric semiconductor elements 3B positioned below the partitioning plate 2 are in direct contact with a gas such as air or a coolant, and heat is removed thereby (in FIG. 1E, the portions shown hatched below the partitioning plate 2 are in direct contact with a gas such as air or a coolant). Since the T-shaped copper electrodes 5 are located within the coolant or the like, they are preferably plated with nickel or tin. In addition, to prevent oxidation or corrosion of the T-shaped copper electrodes 5 by the coolant, a coating 6 of silicon resin or the like is preferably formed thereover, including the surfaces in contact with the thermoelectric semiconductor elements. Since the thermoelectric module in accordance with this embodiment has a double-sided skeleton structure, the thermal stresses applied to the thermoelectric semiconductor elements are alleviated thereby and, as a result, the lifetime of the thermoelectric semiconductor elements is extended. Since the heat-radiating side is cooled directly, heat is efficiently extracted from the heat-radiating side and thus the cooling capability of the thermoelectric semiconductor elements is exhibited to the maximum limit.

Figure 1:
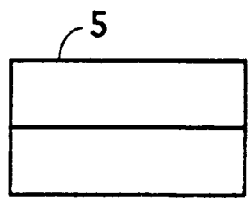
Figure 1:
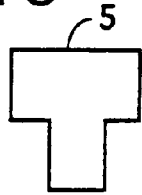
Figure 1:
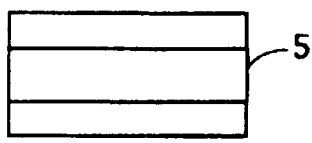
Figure 1:
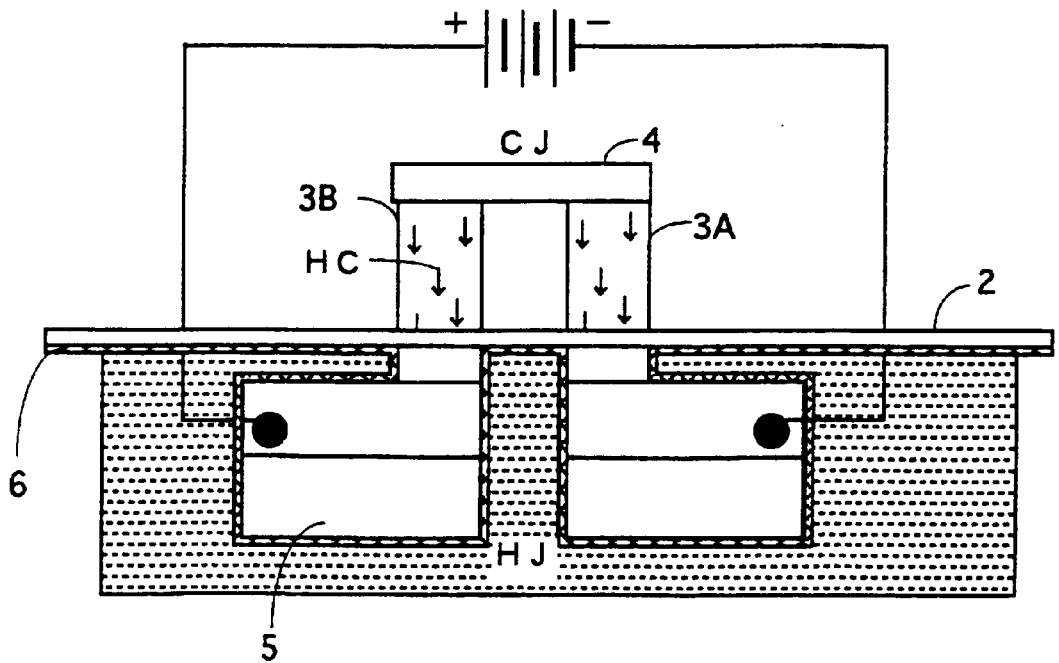
Figure 2:
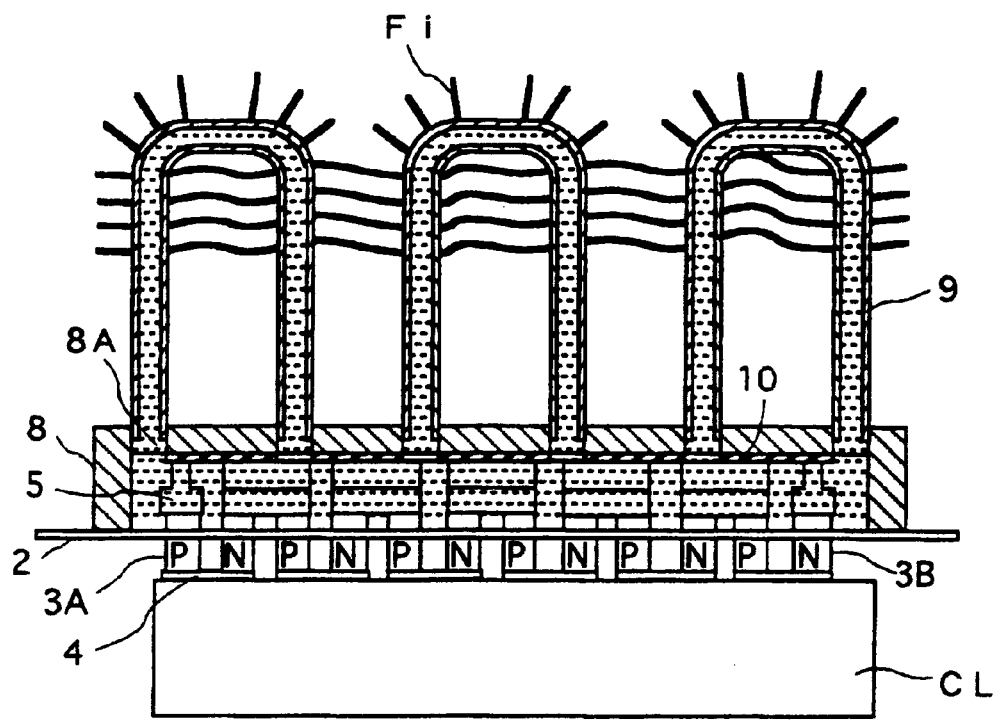
FIG. 2 shows a thermoelectric module unit using the thermoelectric module of FIG. 1.

A thermoelectric module unit that uses the thermoelectric module of FIG. 1 is shown in FIG. 2. As shown in this figure, a cooling load CL is fixed to the lower surface of the copper electrodes 4 on the lower side of the thermoelectric module (corresponding to the upper side in FIG. 1A). In addition, a box-shaped case 8 is fixed to the upper surface of the partitioning plate 2 of the thermoelectric module (corresponding to the lower surface in FIG. 1A). The upper portions of the p-type thermoelectric semiconductor elements 3A and the n-type thermoelectric semiconductor elements 3B that protrude from the partitioning plate 2 are disposed within the case 8 together with the T-shaped copper electrodes 5. An electrical insulating layer 10 is provided on the side of the inner walls of the case 8 that faces the T-shaped copper electrodes 5. Tips of heat pipes 9 of a U-shaped section are fixed to through holes 8A that open into the upper surface of the case 8. Note that the cross-sectional shape of the heat pipes 9 in the direction perpendicular to the plane of the paper could have a circular shape or a flat shape. A metal such as *heapel* (product name), made by Sumitomo Light Metal Industries, could be used for these heat pipes 9.

The case 8 and the heat pipes 9 are made of a metal such as copper or alminum. The interior of the heat pipes 9 have a capillary tube structure. After a sealed structure is formed by fixing the box-shaped case 8 to the upper surface of the partitioning plate 2 then fixing the heat pipes 9 to the upper surface of the case 8, a predetermined quantity of an operating fluid (such as water or freon) is vacuum-sealed into the interior thereof. In FIG. 2, the portions filled with the operating fluid are shown hatched (this also applies to FIGS. 4, 5, and 9 which will be discussed later). A large number of fins Fi are attached to the heat pipes 9. Although not shown in the figures, a sealing structure formed of an adhesive or rubber material (such as chloroprene, ethylene propylene, or chlorinated polyethylene is provided between the partitioning plate 2 and the case 8.

When the operating fluid is heated by the T-shaped copper electrodes 5 in the thus constructed thermoelectric module unit, it evaporates and turns into steam. During this process, heat is absorbed by the latent heat of evaporation thereof. This steam moves at high speed to the low-temperature portions (upward, in the heat pipes 9 shown in FIG. 2). The steam is cooled by the low-temperature portions to condense and become a liquid. During this process, heat is emitted by the latent heat of condensation thereof. The condensate is returned to the heated portions by capillary action, and the cycle of steam generation/ movement/condensation is repeated to transfer heat continuously and efficiently.

Figure 3A:
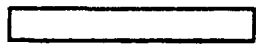
FIG. 3 shows other examples of the structure of the electrode on the heat-radiating side of the thermoelectric module of this embodiment of the invention.
Figure 3B:
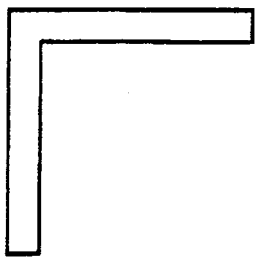
Figure 3C:
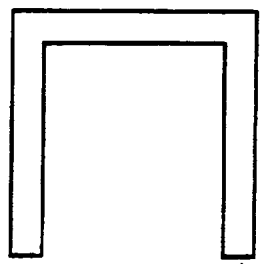

Note that the shape of the electrodes on the heat-radiating side could be any of: flat as shown in the side view of FIG. 3A, L-shaped as shown in the side view of FIG. 3B, or U-shaped as shown in the side view of FIG. 3C. The electrodes on the heat-absorbing side could be configured of any shape suitable for the cooling load.

Figure 4:
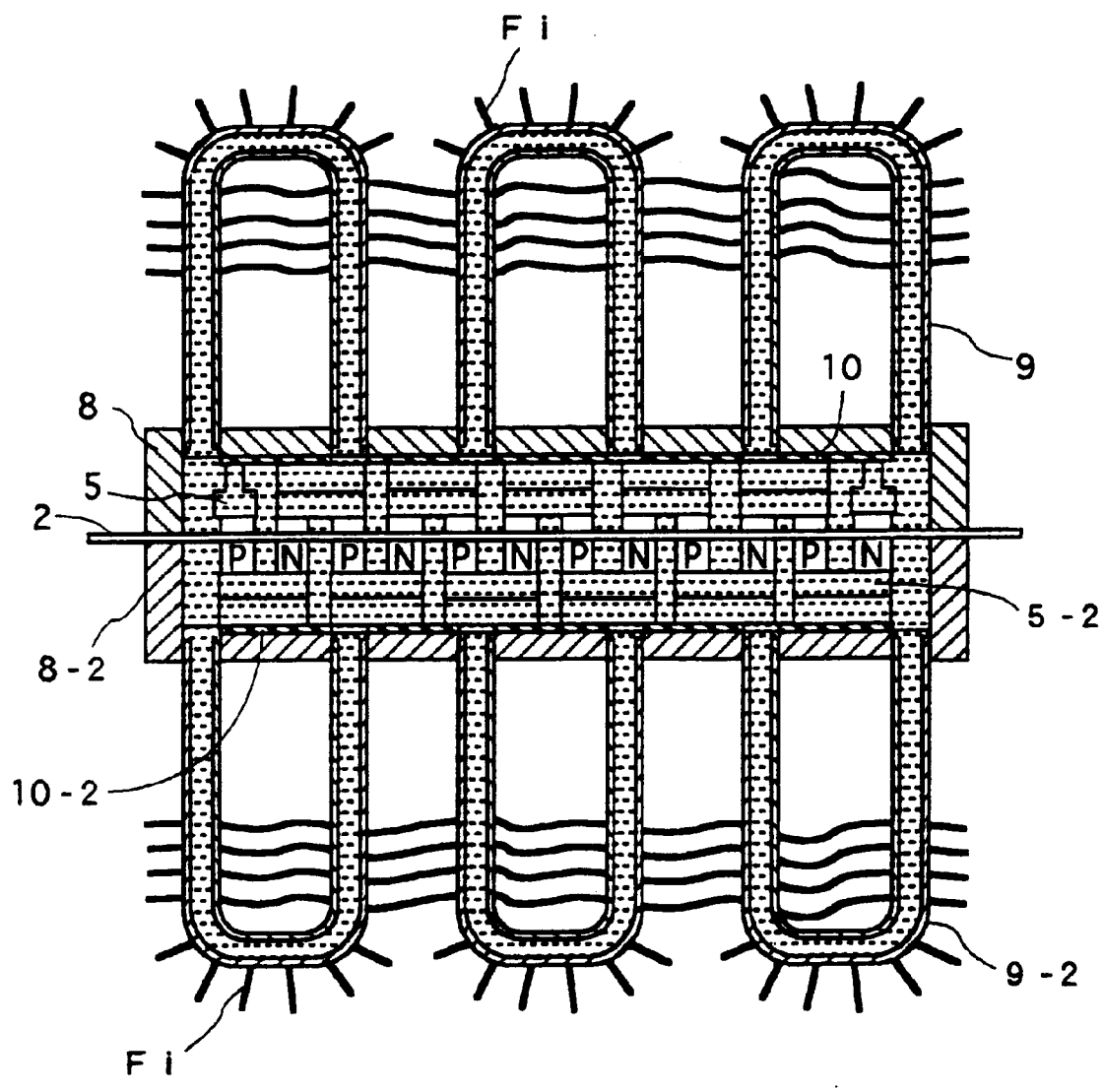
FIG. 4 shows another example of the structure of the thermoelectric module unit using the thermoelectric module of FIG. 1.
Figure 5:
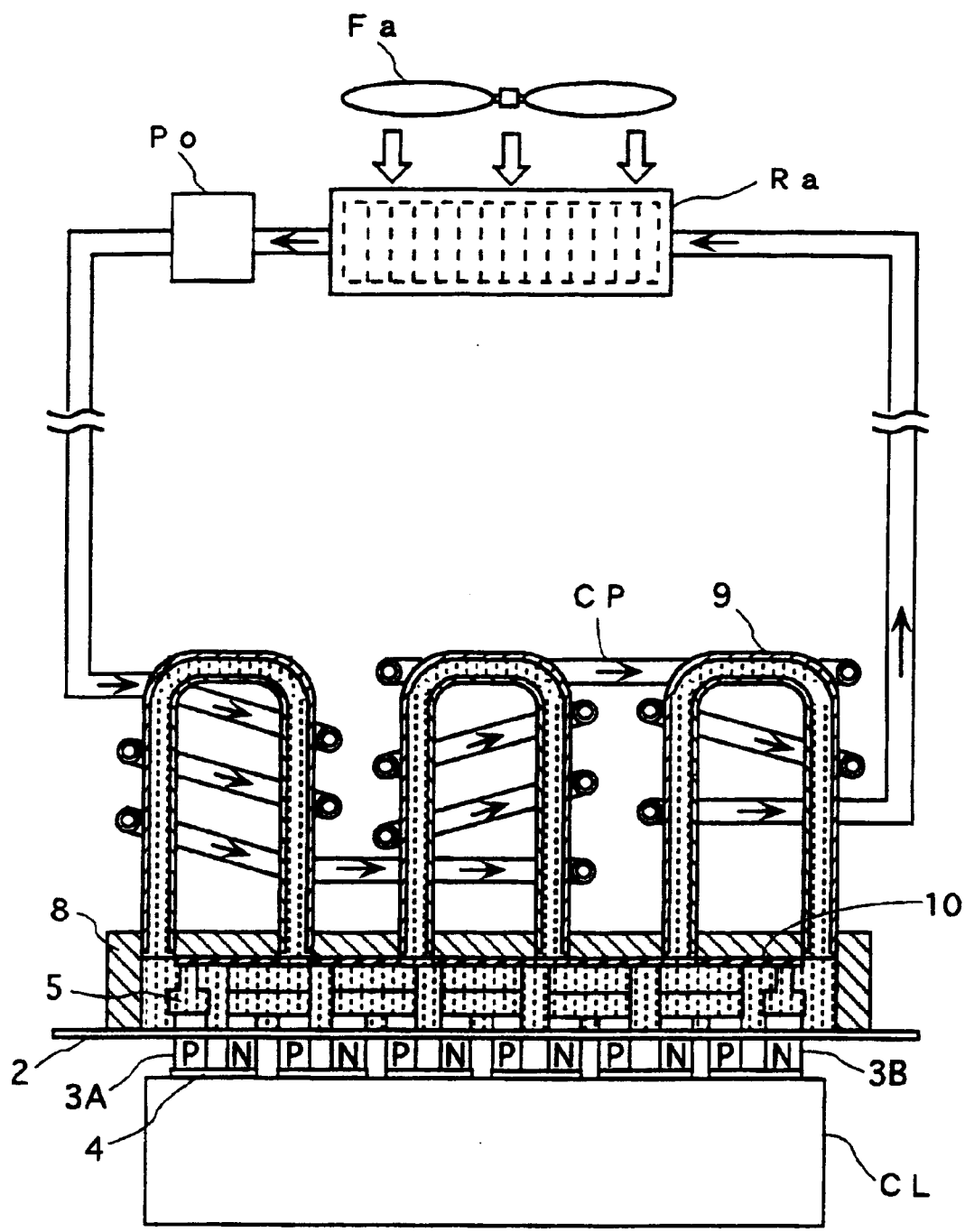
FIG. 5 shows a further example of the structure of the thermoelectric module unit using the thermoelectric module of FIG. 1.

Another example of the structure of the thermoelectric module unit is shown in FIG. 4. In this thermoelectric module unit, T-shaped copper electrodes 5-2 are placed on the heat-absorbing side of the thermoelectric module in a similar manner to that of the copper electrodes on the heat-radiating side, and these are disposed within a case 8-2 to which heat pipes 9-2 are attached. In this configuration, the case 8-2 could be made of a metal such as copper or alminum , or it could be made of a resin. If it is made of a resin, an electrical insulating layer 10-2 would not be necessary. Note that there are sealing structures between the partitioning plate 2 and each of the case 8 and the case 8-2, in a similar manner to that of FIG. 2.

In FIGS. 2 and 4, an even more efficient dispersion of heat can be obtained by cooling the heat pipes 9 by an air-cooling fan or by water, or by earth. If a fluid such as air or water is used to cool the heat pipes 9, the air or water is supplied to the heat pipes 9 in such a manner that it flows within a tunnel formed by a plurality of the heat pipes 9 (the inner sides of the U-shaped curves of the heat pipes 9). In a thermoelectric module unit shown in FIG. 5, by way of example, the configuration is such that a liquid-cooling pipe CP is wound around the periphery of the heat pipes 9, and the liquid-cooling pipe CP is connected to a coolant heat dispersion and circulation system comprising a radiator Ra, a fan Fa, and a pump Po that are located at a distance from this liquid-cooling pipe CP (such as outside), so that the heat pipes 9 are cooled by this coolant. Note that the hollow arrows in FIG. 5 indicate the flow of air and the solid arrows indicate the flow of coolant.

Figure 6A:
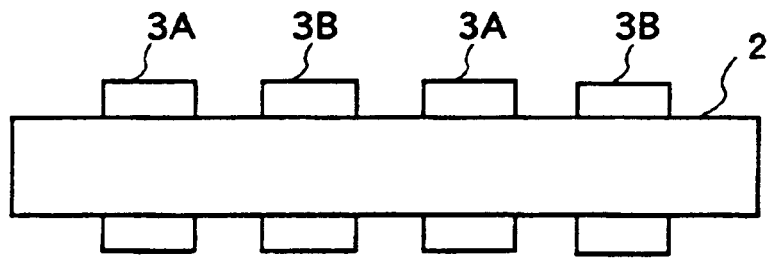
FIG. 6 shows examples of the structures of strengthened partitioning plates.
Figure 6B:
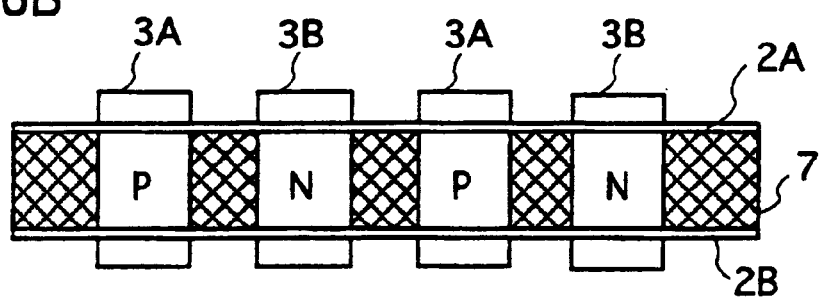
Figure 6C:
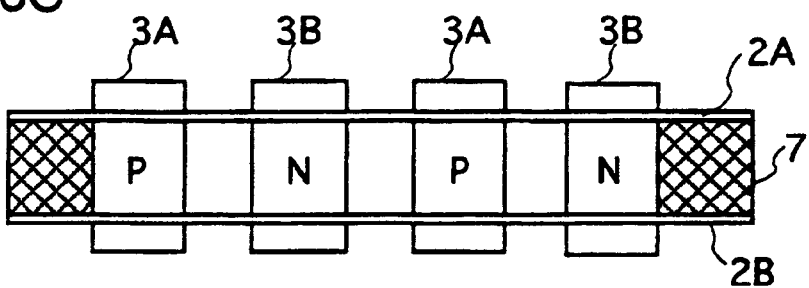
Figure 6D:
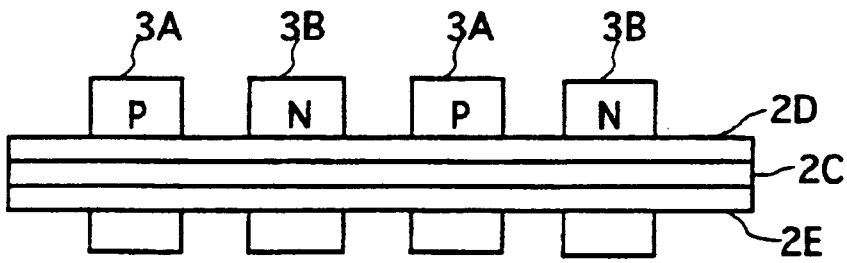

Examples of structures of the partitioning plate that have improved strengths are shown in FIGS. 6A to 6D. In FIG. 6A, the thickness of the electrically insulating partitioning plate 2 has been increased. In FIG. 6B, two partitioning plates 2A and 2B of approximately the same thickness of the partitioning plate 2 of FIG. 1 are provided on an upper side and a lower side, and the entire space therebetween is filled with a resin 7 such as a polyimide or epoxy to fix them together. In FIG. 6C, two partitioning plates 2A and 2B are provided in a manner similar to that of FIG. 6B, but only the peripheral portions of the space therebetween is filled with the resin 7 to fix them together. In FIG. 6D, an electrically insulating plate 2C is sandwitched between plates 2D, 2E which are made of metal such as alminum or stainless steel.

The structural examples shown in FIGS. 6A to 6C can basically be fabricated by means as disclosed in the above mentioned Japanese Patent Application Laid-Open No. 8-228027. Note, however, that it is necessary to add a step of injecting the resin 7 in the structural examples of FIGS. 6B and 6C. In the structural example of FIG. 6D, a process is utilized by which a layer of a resin (product name: parylene resin) is formed by coating or chemical vapor deposition on outer surfaces of needle-shaped thermoelectric semiconductor crystals, as disclosed in Japanese Patent Application Laid-Open No. 8-228027, to impart insulating properties thereto, then the thermoelectric semiconductor crystals are inserted into and attached to an electrically insulating plate which is sandwitched between metal plates sticked thereto.

The resultant increase in strength of the partitioning plate in each of the structural examples of FIGS. 6A to 6D makes it possible to prevent damage to the thermoelectric module due to the pressure applied when the operating fluid is sealed into the interior of the case 8 and the heat pipes 9, or the pressures experienced during operation.

Figure 7A:
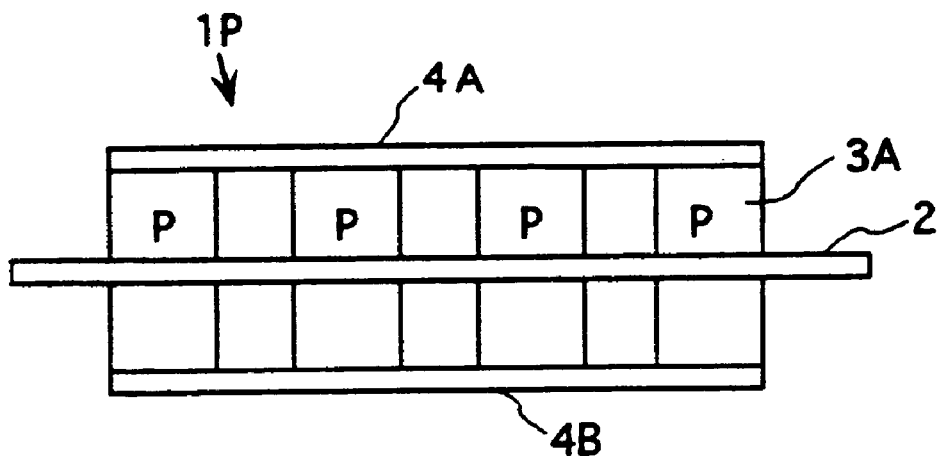
FIG. 7 shows further examples of the structure of the thermoelectric module.
Figure 7B:
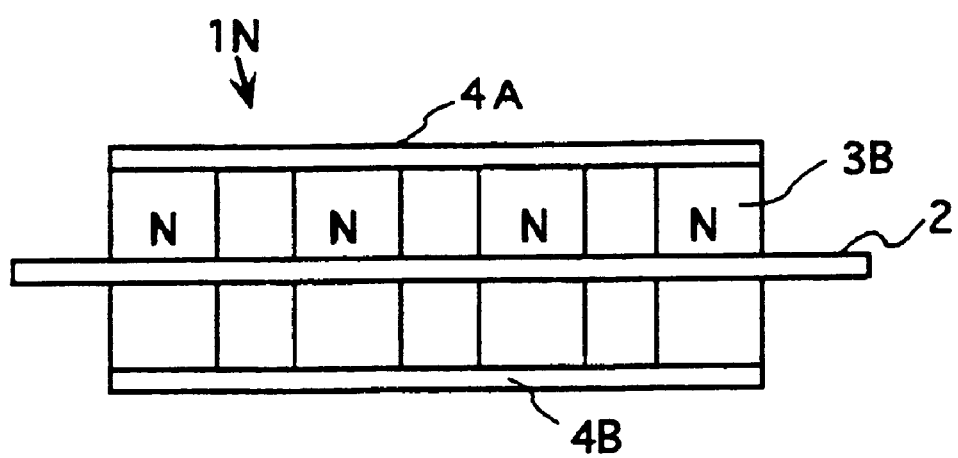

Further examples of the structure of the thermoelectric module are shown in FIGS. 7A and 7B. FIG. 7A shows a p-type module and FIG. 7B shows an n-type module. In a p-type module 1P, a plurality (four in this figure) of the p-type thermoelectric semiconductor elements 3A alone are fixed to the partitioning plate 2 in a state in which they pass through the partitioning plate 2, and an upper-side copper electrode 4A and a lower-side copper electrode 4B are connected to the upper and lower sides, respectively, of all the p-type thermoelectric semiconductor elements 3A. Similarly, in an n-type module 1N, a plurality of n-type thermoelectric semiconductor elements 3B alone are fixed to the partitioning plate 2 in a state in which they pass through the partitioning plate 2, and an upper-side copper electrode 4A and a lower-side copper electrode 4B are connected to the upper and lower sides, respectively, of all the n-type thermoelectric semiconductor elements 3B. When a DC voltage is applied to the upper and lower electrodes of each of these thermoelectric modules so that a current flows therethrough, this current flows through all of the thermoelectric semiconductor elements in parallel.

Figure 8:
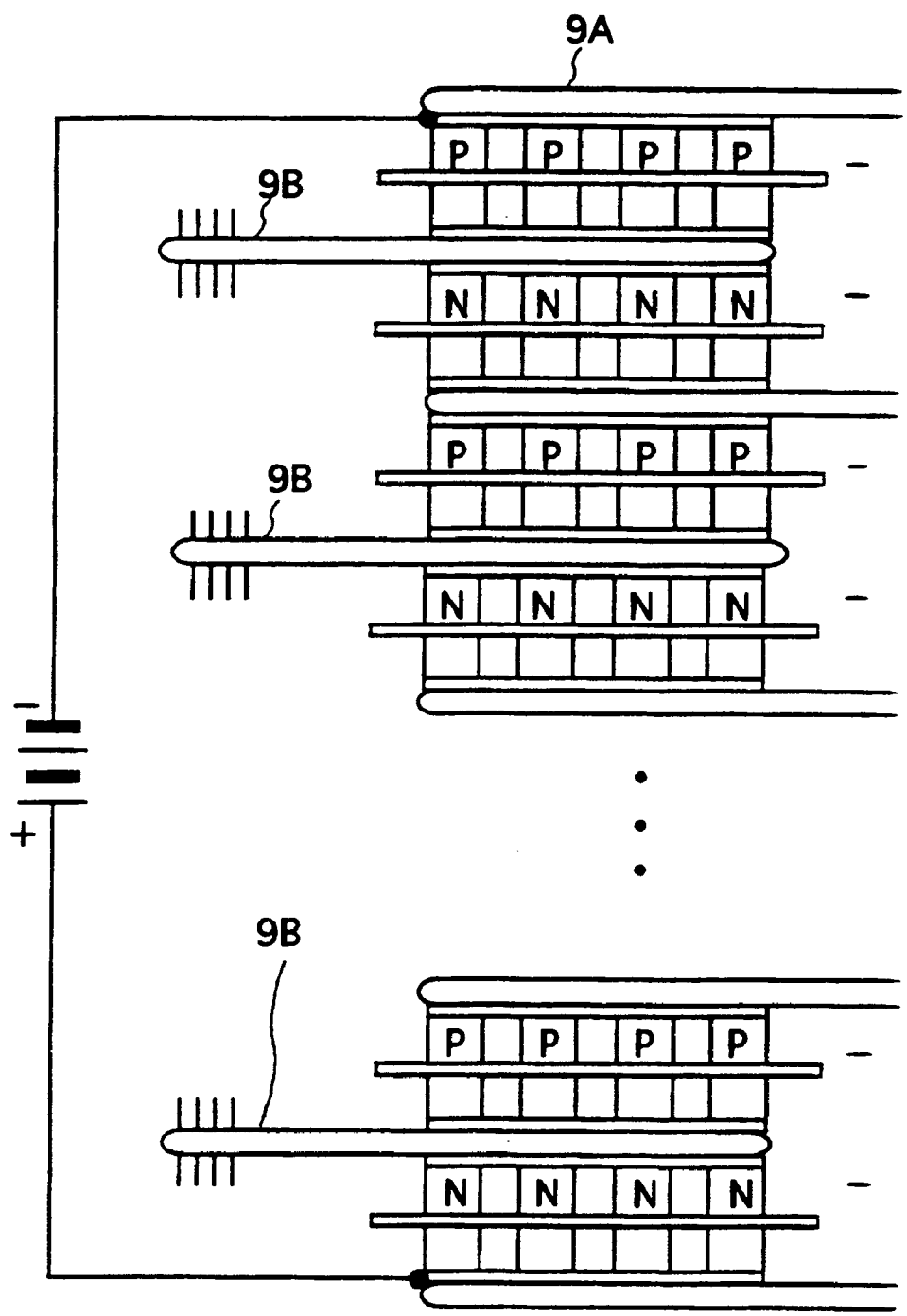
FIG. 8 shows an example of the structure of a thermoelectric module unit using the thermoelectric modules of FIG. 7.

An example of the structure of a thermoelectric module unit using the thermoelectric modules of FIG. 7 is shown in FIG. 8. This thermoelectric module unit has a configuration in which p-type modules 1P and n-type modules 1N are stacked alternately, and heat pipes are fixed between adjacent modules. One end of each heat pipe is attached in such a manner that these ends extend alternately to the right and left. The configuration is such that a DC voltage can be applied between an upper copper electrode of the p-type module 1P on the upper side and a lower copper electrode of the n-type module 1N on the lower side, so that a current flows therebetween.

When this DC current flows from the lower side of the thermoelectric module unit towards the upper side thereof, as shown in FIG. 8, the heat pipes 9A attached thereto so as to extend towards the right become heat-radiating pipes and the heat pipes 9B attached thereto so as to extend towards the left become heat-absorbing pipes. Since the operation of these heat pipes is clear from the description of the heat pipes of FIG. 2, further description is omitted.

If the configuration shown in FIG. 8 is used, it can be matched to the optimal operating current for use by setting the number of thermoelectric semiconductor elements, and the outer surface areas of the heat-radiating surfaces and heat-absorbing surfaces can be increased, thus improving the thermal transfer efficiency.

Figure 9:
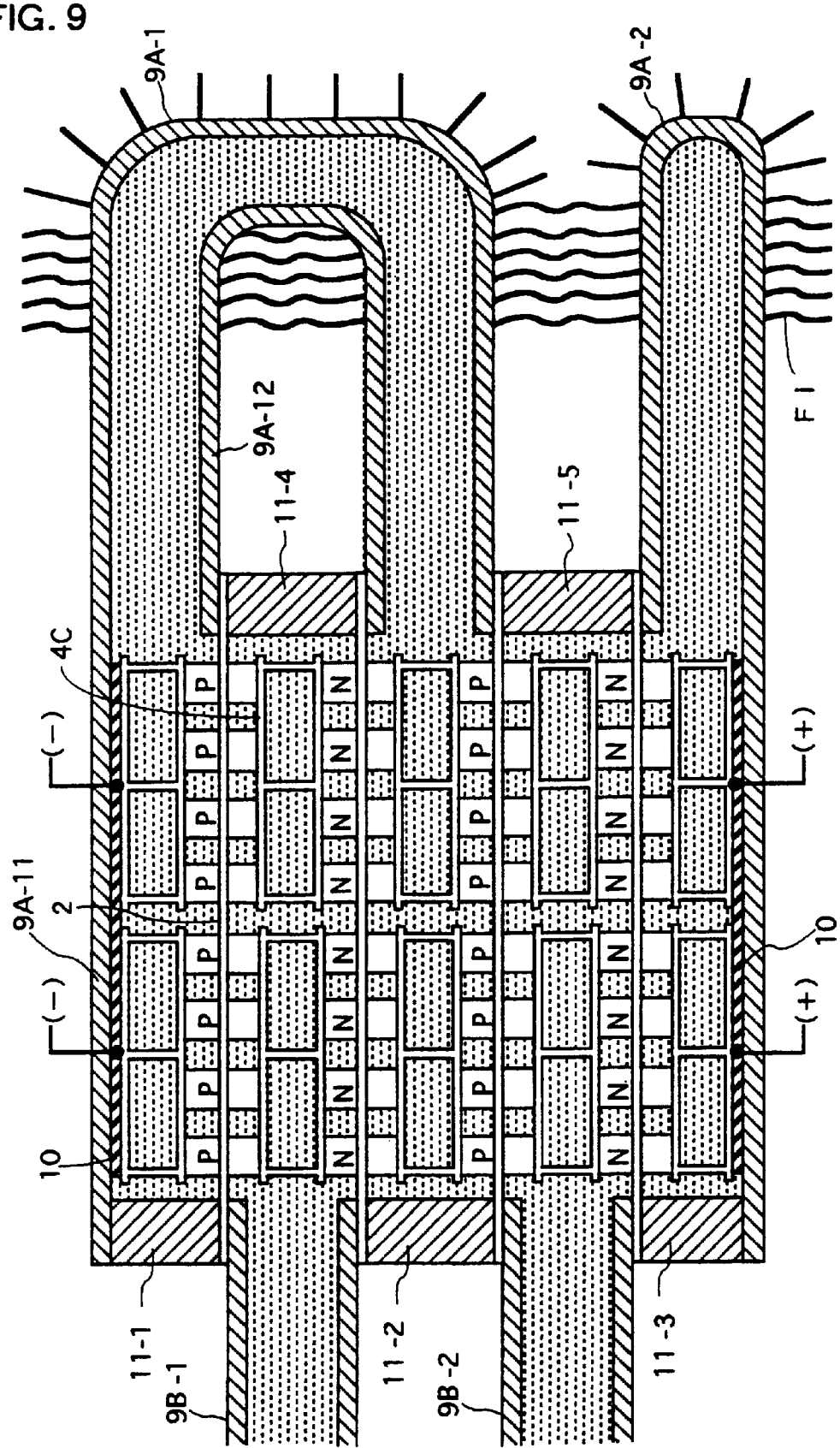
FIG. 9 shows another example of the structure of the thermoelectric module unit using the thermoelectric modules of FIG. 7, wherein only the shape of the electrodes is different.

Another example of the structure of a thermoelectric module unit using the thermoelectric modules of FIG. 7, but with a different electrode shape, is shown in FIG. 9. In this thermoelectric module unit, p-type modules and n-type modules are stacked alternately, and copper electrodes 4C between adjacent modules are used in common by the p-type modules and n-type modules. In other words, the configuration is such that a plurality of p-type thermoelectric semiconductor elements, in a state in which they pass through partitioning plates 2 but are fixed to those partitioning plates 2, and a plurality of n-type thermoelectric semiconductor elements, in a state in which they pass through partitioning plates 2 but are fixed to those partitioning plates 2, are sandwiched alternately between five copper electrodes 4C disposed equidistantly in the vertical direction. In addition, a plurality of groups (two groups in FIG. 9) of blocks of four thermoelectric modules stacked in this manner are provided, with the partitioning plates of these blocks that are disposed at the same height being formed integrally. A DC voltage is applied in such a manner that the copper electrode at the lower end of these blocks is positive and the copper electrode at the upper end thereof is negative, so that a DC current flows therethrough.

In addition, two heat pipes are attached to each of a heat-radiating side and a heat-absorbing side. A first heat pipe 9A-1 on the heat-radiating side is configured of an outer side member 9A-11 of a substantially J-shaped section and an inner side member 9A-12 of a substantially U-shaped section. The outer side member 9A-11 is fixed to the upper side of the uppermost p-type module and the upper surface of the partitioning plate of the third-stage p-type module, and the inner side member 9A-12 is fixed to the upper surface of the partitioning plate of the uppermost p-type module and the lower surface of the partitioning plate of the second-stage n-type module. A -second heat pipe 9A-2 on the heat-radiating side has a substantially J-shaped section. It is fixed to the lower side of the lowermost n-type module and the lower surface of the partitioning plate thereof. A first heat pipe 9B-1 on the heat-absorbing side and a second heat pipe 9B-2 on the heat-absorbing side each have a substantially U-shaped section (part of each U-shape is not shown in the figure). The right end of the first heat pipe 9B-1 on the heat-absorbing side is fixed to the lower surface of the partitioning plate of the uppermost p-type module and the upper surface of the partitioning plate of the second-stage n-type module, and the right end of the second heat pipe 9B-2 on the heat-absorbing side is fixed to the lower surface of the partitioning plate of the third-stage p-type module and the upper surface of the partitioning plate of the lowermost n-type module.

An electrical insulating layer 10 is provided between an end portion of the outer side member 9A-11 of the first heat pipe 9A-1 on the heat-radiating side and the copper electrode on the upper side of the uppermost p-type module. Similarly, an electrical insulating layer 10 is provided between the second heat pipe 9A-2 on the heat-radiating side and the copper electrode on the lower side of the lowermost n-type module. These electrical insulating layers 10 prevent any short-circuiting of the DC power source by the heat pipes 9A and 9B and the fins Fi thereof.

A gap between a left end portion of the outer side member 9A-11 of the first heat pipe 9A-1 on the heat-radiating side and a left end portion of the partitioning plate of the uppermost p-type module is closed by a lid 11-1, and a gap between left end portions of the partitioning plates of the second-stage n-type module and the third-stage p-type module is closed by a lid 11-2. This forms a space that is enclosed by these lids 11-1 and 11-2, the upper side of the partitioning plate of the uppermost p-type module, the first heat pipe 9A-1 on the heat-radiating side, the lower side of the partitioning plate of the second-stage n-type module, and the upper side of the partitioning plate of the third-stage p-type module. These lids 11-1 and 11-2 could be made of a metal such as copper or alminum, or of a resin. In addition, a sealing structure of an adhesive or rubber material (not shown in the figure) is provided between each of the lids 11-1 and 11-2 and the portions closed thereby, in a similar manner to that between the partitioning plate 2 and the case 8 in FIG. 2.

Similarly, a gap between a left end portion of the second heat pipe 9A-2 on the heat-radiating side and a left end portion of the partitioning plate of the lowermost n-type module is closed by a lid 11-3 to form a space that is enclosed by this lid 11-3, the second heat pipe 9A-2 on the heat-radiating side, and the lower side of the partitioning plate of the lowermost n-type module. In addition, a gap between right end portions of the partitioning plates of the uppermost p-type module and the second-stage n-type module is closed by a lid 11-4 to form space that is enclosed by these partitioning plates, the first heat pipe 9B-1 on the heat-absorbing side, and the lid 11-4. Furthermore, a gap between right end portions of the partitioning plates of the third-stage p-type module and the lowermost n-type module is closed by a lid 11-5 to form a space that is enclosed by these partitioning plates, the second heat pipe 9B-2 on the heat-absorbing side, and the lid 11-5.

The thermoelectric module unit is completed by vacuum-sealing a predetermined quantity of an operating fluid into each of these enclosed spaces. The operation of the heat pipes of this thermoelectric module unit is similar to that of the heat pipes of the thermoelectric module unit shown in FIG. 2.

Figure 10A:
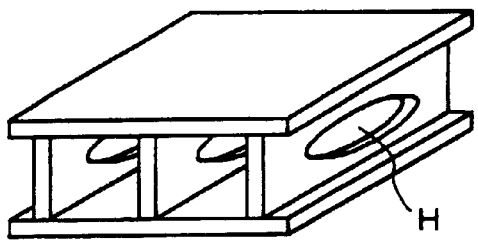
FIG. 10 shows perspective views of variants of the copper electrodes of FIG. 9.
Figure 10B:
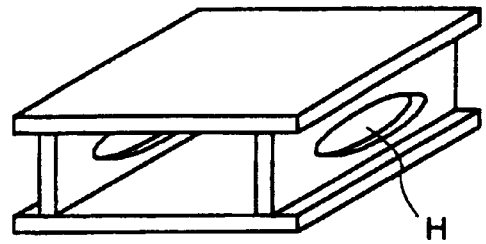
Figure 10C:
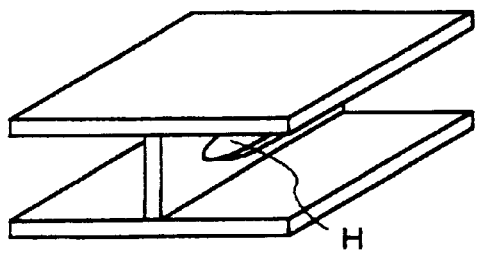
Figure 10D:
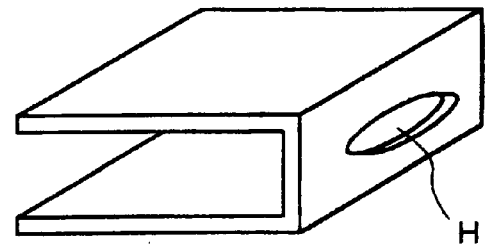
Figure 10E:
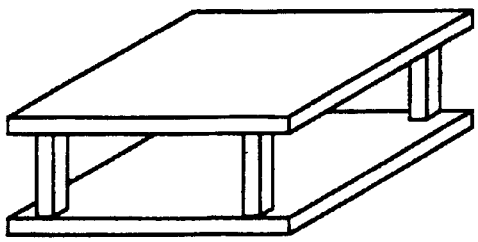
Figure 11A:
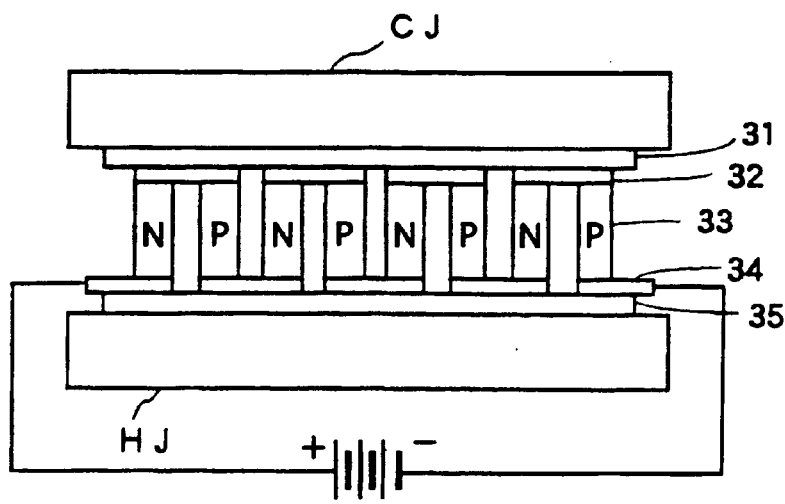
FIG. 11 shows the structure of a prior-art thermoelectric module.
Figure 11B:
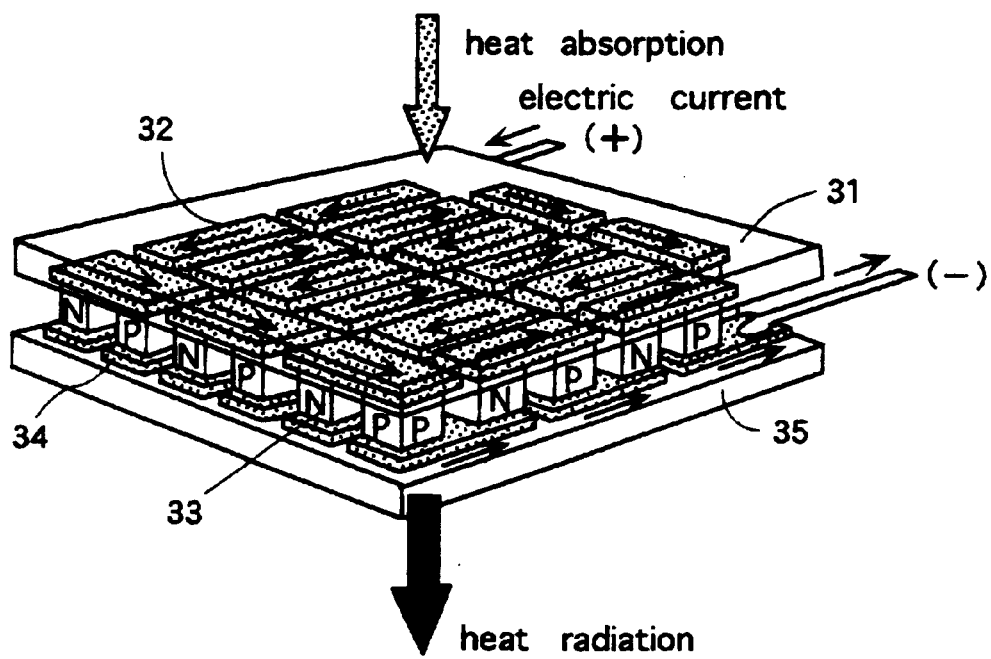
Figure 12A:
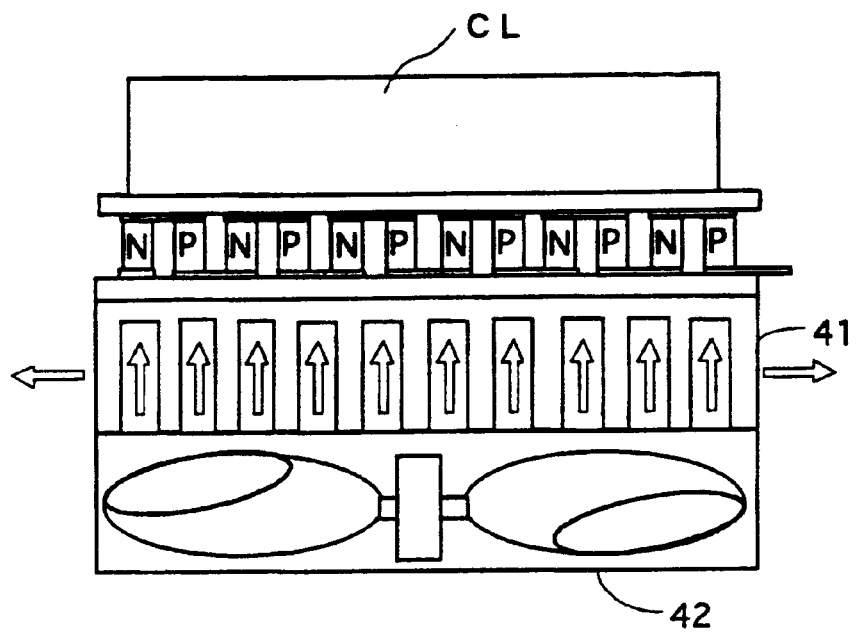
FIG. 12 shows the cooling method used in the prior-art thermoelectric module.
Figure 12B:
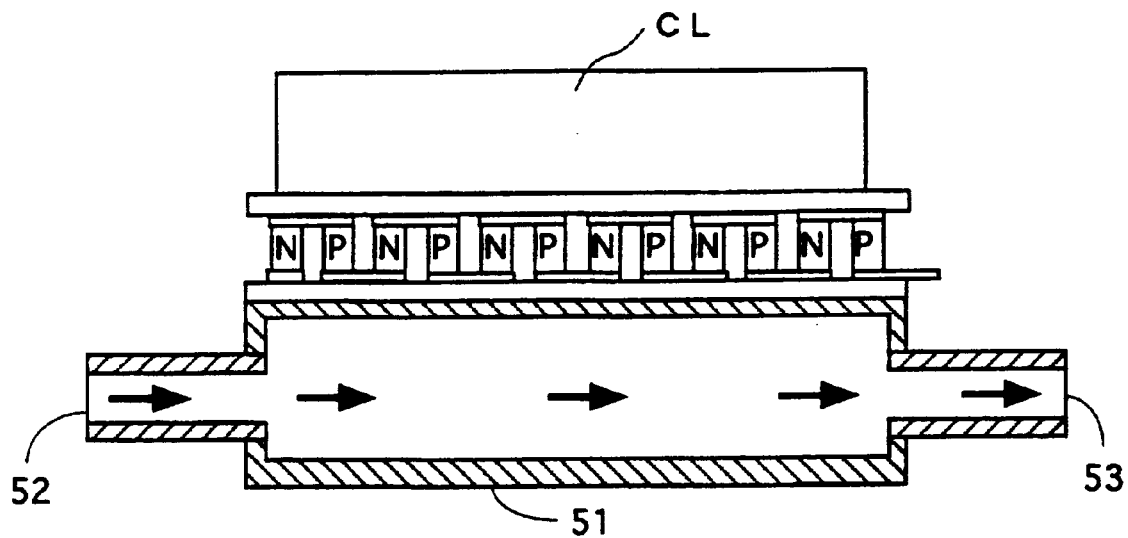

Perspective views of variants of the copper electrodes 4C of FIG. 9 are shown in FIGS. 10A to 10B. In FIG. 10A, holes H are formed in three linking plate members that connect a plate member on the upper surface of each copper electrode 4C of FIG. 9 to a plate member on the lower surface thereof, to ensure that the flow of the operating fluid therethrough is smoother. In FIG. 10B, there are two linking plate members at the ends, and in FIG. 10C, there is one linking plate member at the center. In FIG. 10D, the entire structure has a U-shaped configuration. In FIG. 10B, an upper plate member and a lower plate member are linked by four columnar members. Since the flow of the operating fluid is smoother if there is a smaller number of linking plate members, or if holes are formed in these late members, the thermal transfer efficiency is increased thereby. The provision of columnar members such as those shown in FIG. 10E smooths the flow of operating fluid even further.

Industrial Applicability

A thermoelectric module unit in accordance with this invention can be used as a cooling or heating device in a wide range of applications, such as a cooling device for a semiconductor integrated circuit, or a cooling or heating device for a refrigerator or drinking water dispenser.

What is claimed is:

1. A thermoelectric module unit comprising: a thermoelectric module that comprises a partitioning plate, a thermoelectric semiconductor element fixed to said partitioning plate in a state passing through said partitioning plate but also in a state that is electrically insulated from said partitioning plate; a first metal electrode connected to a first surface of said thermoelectric semiconductor element; and a second metal electrode connected to a second surface of said thermoelectric semiconductor element; and a first confined portion which encloses a region from said partitioning plate towards said first surface and which is also connected to a first heat pipe; wherein: an operating fluid is vacuum-sealed within said first confined portion and said first heat pipe.

2. The thermoelectric module unit as defined in claim 1, further comprising a second confined portion which encloses a region from said partitioning plate towards said second surface and which is also connected to a second heat pipe, wherein an operating fluid is vacuum-sealed into said second heat pipe.

3. The thermoelectric module unit as defined in claim 2, wherein said first heat pipe is on a heat-radiating side and said second heat pipe is on a heat-absorbing side.

4. The thermoelectric module unit as defined in claim 1, 2, or 3, wherein identical numbers of p-type thermoelectric semiconductor elements and n-type thermoelectric semiconductor elements are fixed to said partitioning plate, and also all of said thermoelectric semiconductor elements are connected electrically in series by said first metal electrode and said second metal electrode.

5. The thermoelectric module unit as defined in claim 1, 2, or 3, wherein only one of a group of p-type thermoelectric semiconductor elements or a group of n-type thermoelectric semiconductor element is fixed to said partitioning plate, and also first surfaces of all of said p-type thermoelectric semiconductor elements or said n-type thermoelectric semiconductor elements are connected in common by said first metal electrode, and second surfaces of all of said p-type thermoelectric semiconductor elements or said n-type thermoelectric semiconductor elements are connected in common by said second metal electrode.

6. The thermoelectric module unit as defined in claim 5, wherein thermoelectric modules in which only p-type thermoelectric semiconductor elements are fixed to partitioning plates thereof are stacked alternately with thermoelectric modules in which only n-type thermoelectric semiconductor elements are fixed to partitioning plates thereof, and metal electrodes of adjacent portions are used in common.

7. The thermoelectric module unit as defined in claim 6, wherein blocks of said alternately stacked thermoelectric modules are disposed in a plurality of groups in the horizontal direction.

8. The thermoelectric module unit as defined in claim 7, wherein partitioning plates at the same height are formed integrally in the horizontal direction.

9. The thermoelectric module unit as defined in claim 1, wherein said partitioning plate is constructed of an electrically insulating material.

10. The thermoelectric module unit as defined in claim 9, wherein said partitioning plate is configured of two partitioning plates and at least a portion of a space therebetween is filled with a resin.

11. The thermoelectric module unit as defined in claim 1, wherein said partitioning plate is formed of metal plates, and electrically insulating plate which is sandwiched between said metal plates; and peripheral portions of said thermoelectric semiconductor elements are covered with an electrically insulating material.

12. A thermoelectric module unit comprising: a first thermoelectric module that comprises a first partitioning plate, ap-type thermoelectric semiconductor element fixed to said first partitioning plate in a state passing through said first partitioning plate but also in a state that is electrically insulated from said first partitioning plate, a first metal electrode connected to a first surface of said p-type thermoelectric semiconductor element, and a second metal electrode connected to a second surface of said p-type thermoelectric semiconductor element; alternately stacked with a second thermoelectric module that comprises a second partitioning plate, an n-type thermoelectric semiconductor element fixed to said second partitioning plate in a state passing through said second partitioning plate but also in a state that is electrically insulated from said second partitioning plate, a third metal electrode connected to a first surface of said n-type thermoelectric semiconductor element, and a fourth metal electrode connected to a second surface of said n-type thermoelectric semiconductor element; wherein a heat pipe is sandwiched between adjacent thermoelectric modules, a heat pipe is attached to the top of the uppermost thermoelectric module, and a heat pipe is attached to the bottom of the lowermost thermoelectric module.

* * * * *